United States Patent
Wang et al.

(10) Patent No.: US 11,670,502 B2
(45) Date of Patent: Jun. 6, 2023

(54) SIC MOSFET AND METHOD FOR MANUFACTURING THE SAME

(71) Applicant: Hangzhou Silicon-Magic Semiconductor Technology Co., Ltd., Hangzhou (CN)

(72) Inventors: Jiakun Wang, Hangzhou (CN); Hui Chen, Hangzhou (CN); Bing Wu, Hangzhou (CN)

(73) Assignee: HANGZHOU SILICON-MAGIC SEMICONDUCTOR TECHNOLOGY CO., LTD., Hangzhou (CN)

( * ) Notice: Subject to any disclaimer, the term of this patent is extended or adjusted under 35 U.S.C. 154(b) by 154 days.

(21) Appl. No.: 17/235,103

(22) Filed: Apr. 20, 2021

(65) Prior Publication Data

US 2021/0335605 A1  Oct. 28, 2021

(30) Foreign Application Priority Data

Apr. 23, 2020  (CN) .......................... 202010326417.2

(51) Int. Cl.
*H01L 21/02* (2006.01)
*H01L 29/16* (2006.01)
*H01L 21/8234* (2006.01)

(52) U.S. Cl.
CPC .... *H01L 21/02271* (2013.01); *H01L 21/0223* (2013.01); *H01L 21/02592* (2013.01); *H01L 21/02595* (2013.01); *H01L 21/823468* (2013.01); *H01L 29/1608* (2013.01)

(58) Field of Classification Search
CPC ............. H01L 21/0465; H01L 21/0332; H01L 21/0337
See application file for complete search history.

(56) References Cited

U.S. PATENT DOCUMENTS

| | | | |
|---|---|---|---|
| 6,921,697 | B2 | 7/2005 | Darwish et al. |
| 7,772,668 | B2 | 8/2010 | Pan |
| 8,829,641 | B2 | 9/2014 | Marchant |
| 2013/0175549 | A1 | 7/2013 | Okumura |
| 2015/0061002 | A1 | 3/2015 | Tong |
| 2015/0118810 | A1 | 4/2015 | Bobde et al. |
| 2016/0064478 | A1 | 3/2016 | Sun et al. |

OTHER PUBLICATIONS

TW Application No. 110114293 Search Report dated Mar. 24, 2022.

*Primary Examiner* — John A Bodnar
(74) *Attorney, Agent, or Firm* — Alston & Bird LLP

(57) ABSTRACT

A method of making a silicon carbide MOSFET device can include: providing a substrate with a first doping type; forming a patterned first barrier layer on a first surface of the substrate; forming a source region with a first doping type in the substrate; forming a base region with a second doping type and a contact region with a second doping type in the substrate, and forming a gate structure. The first barrier layer can include a first portion and a second portion, the first portion can include a semiconductor layer and a removable layer different from the semiconductor layer, and the second portion can only include the removable layer.

20 Claims, 5 Drawing Sheets

SIC MOSFET AND METHOD FOR MANUFACTURING THE SAME

RELATED APPLICATIONS

This application claims the benefit of Chinese Patent Application No. 202010326417.2, filed on Apr. 23, 2020, which is incorporated herein by reference in its entirety.

FIELD OF THE INVENTION

The present invention generally relates to semiconductor technology, and more particularly to SiC MOSFETs and methods of making SiC MOSFETs.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies may include power switches (e.g., SiC MOSFETs), and can be used to drive light-emitting diode (LED) loads.

DETAILED DESCRIPTION

Figure 1A:
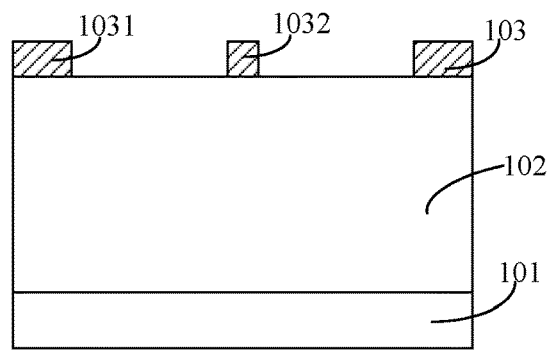
FIGS. 1A-1J show cross-sectional views of various stages of a first example method of manufacturing a silicon carbide MOSFET, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In silicon carbide (SiC) MOSFETs, in order to reduce the cell size and increase the current density, the length of the channel should be set as short as possible. Considering the influence of lithography accuracy, a channel with length less than 0.5 um can generally use a self-aligned process. Due to the low diffusion coefficient of SiC, a silicon (Si) standard self-aligned process may not be used to form the channel. Channel self-aligned processes of some example SiC MOSFETs can include a p-type base region formed using photolithographed polysilicon as a barrier layer, where the polysilicon is oxidized and a certain thickness of silicon dioxide is formed on an upper surface and side surfaces of the polysilicon, and self-aligned implantation of N+ source region can be realized using silicon dioxide on the side surfaces as a barrier layer. In addition, when forming the P+ contact region, because the ion implantation dose of the N+ source region can be much larger than that of the P+ contact region, a separate mask may be utilized in order to form the barrier layer of the P+ contact region, which can increase manufacturing costs.

It should be understood that when one layer or region is referred to as being "above" or "on" another layer or region in the description of a device structure herein, it can be directly above or on the other layer or region, or other layers or regions may be therebetween. Moreover, if the device in the figures is turned over, the layer or region will be "under" or "below" the other layer or region. In contrast, when one layer is referred to as being "directly on" or "on and adjacent to" or "adjoining" another layer or region, there may not be any intervening layers or regions. Some particular details of the present disclosure will be described below, such as exemplary semiconductor structures, materials, dimensions, process steps, and technologies of the semiconductor device. However, one skilled in the art will recognize that these details can be varied in a specific implementation of certain embodiments.

Unless the context clearly indicates otherwise, each part of the semiconductor device can be made of material(s) well known to one skilled in the art. The semiconductor material can include, e.g., a group III-V semiconductor, such as GaAs, InP, GaN, and SiC, and a group IV semiconductor, such as Si, and Ge. A gate conductor may be made of any conductive material, such as metal, doped polysilicon, and a stack of metal and doped polysilicon, among others. For example, the gate conductor may be made of one selected from a group consisting of TaC, TiN, TaSiN, HfSiN, TiSiN, TiCN, TaAlC, TiAlN, TaN, PtSix, $Ni_3Si$, Pt, Ru, W, and their combinations. A gate dielectric may be made of SiO2 or any material having a dielectric constant greater than that of SiO2. For example, the gate dielectric may be made of one selected from a group consisting of oxides, nitrides, oxynitrides, silicates, aluminates, and titanates, or any suitable materials.

In particular embodiments, a method of manufacturing a silicon carbide MOSFET device can include: providing a substrate with a first doping type; forming a patterned first barrier layer on a first surface of the substrate; forming a source region with a first doping type in the substrate; forming a base region with a second doping type and a contact region with a second doping type in the substrate, and forming a gate structure. The first barrier layer can include a first portion and a second portion. For example, the first portion can include a semiconductor layer and a removable layer different from the semiconductor layer, and the second portion can only include the removable layer.

Referring now to FIGS. 1A-1J, shown cross-sectional views of various stages of a first example method of making a silicon carbide MOSFET, in accordance with embodiments of the present invention. In FIG. 1A, patterned deposition layer 103 can be formed on a first surface of a base layer. For example, the base layer with a first doping type may be provided, a deposition layer can be formed on a first surface of the base layer, and the deposition layer may be etched using a first mask, in order to form patterned deposition layer 103. For example, the deposition layer can be formed by a deposition process. In this example, the base layer can include semiconductor substrate 101 of the first doping type and epitaxial layer 102 of the first doping type on the semiconductor substrate. That is, patterned deposition layer 103 can be formed on a first surface of epitaxial layer 102. A second surface of epitaxial layer 102 may be in contact with semiconductor substrate 101, and the first surface of epitaxial layer 102 can be opposite to the second surface of epitaxial layer 102.

Patterned deposition layer 103 can include first part 1031 located at edge areas of the first surface of epitaxial layer 102, and second part 1032 located at a middle area of the first surface of epitaxial layer 102. A width of second part 1032 may be controlled in order to be completely oxidized in the subsequent thermal oxidation process. According to the position of a source region, the first and second parts of patterned deposition layer 103 can be arranged at a corresponding area of the first surface of epitaxial layer 102. In this example, the deposited layer can be polysilicon or amorphous silicon, which may be oxidized to silicon dioxide in the subsequent thermal oxidation process. For example, the width of the second part of the patterned deposition layer 103 may be set according to a length of the channel of the device. Generally, the width of the second part of patterned deposition layer 103 can be set to be not greater than the length of the channel of the device.

Figure 1B:
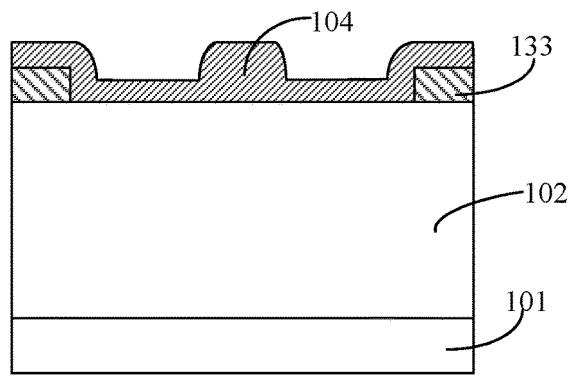

In FIG. 1B, first oxide layer 104 can be formed on surface of patterned deposition layer 103 and the first surface of epitaxial layer 102 by a thermal oxidation process. For example, in the thermal oxidation process, the second part of patterned deposition layer 103 may be completely oxidized into first oxide layer, and the first part of patterned deposition layer 103 can be partially oxidized into first oxide layer. First oxide layer 104 located on side surfaces of the remaining portion of the first part of patterned deposition layer 103 can be configured as sidewalls. The remaining portion of the first part of patterned deposition layer 103 (e.g., the portion that is not oxidized) can be configured as semiconductor layer 133. The conditions (time, temperature, etc.) of the thermal oxidation process may be set in order to control the width of the sidewalls, and to ensure that the second part of deposition layer 103 is completely oxidized.

Figure 1C:
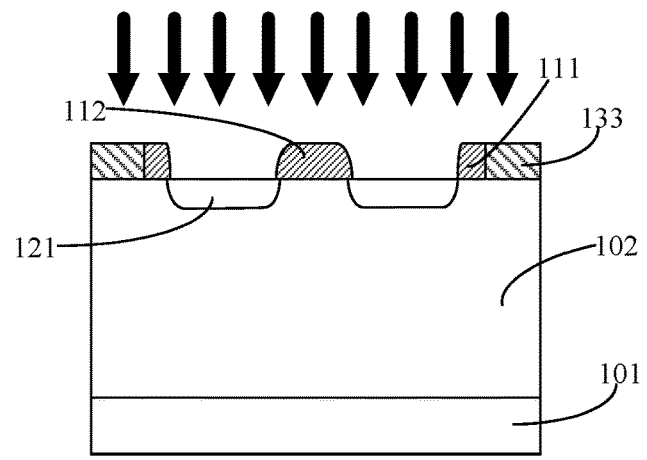

In FIG. 1C, first oxide layer 104 can be etched until the upper surface of semiconductor layer 133 and the first surface of epitaxial layer 102 are exposed to form a first barrier layer. That is, the thickness of etching first oxide layer 104 can be equal to the thickness of first oxide layer 104 on the upper surface of semiconductor layer 133. The first barrier layer can include a first part located at the edge areas of the first surface of epitaxial layer 102, and a second part located at the middle area of the first surface of epitaxial layer 102. The first part of the first barrier layer can include semiconductor layer 133 and removable layer 111. The second part of the first barrier layer can include only removable layer 112. In this example, the removable layer 111 and 112 is an oxide layer.

Then, using the first barrier layer as a mask, source region 121 with the first doping type may be formed in epitaxial layer 102 by a self-aligned ion implantation process. Theoretically, the width of removable layer 111 can be equal to the channel length of the device. However, due to error of the actual process, the difference between the width of removable layer 111 and the length of a channel of the device can be set to be not greater than 5% of the length of a channel of the device. It should be noted that during the process of ion implantation, sometimes a thin film may be needed in order to protect the first surface of the epitaxial layer from damage. Therefore, in other examples, when first oxide layer 104 is etched, a very thin oxide layer may also be left on the first surface of the epitaxial layer, in order to protect the epitaxial layer when forming the source region 121.

Figure 1D:
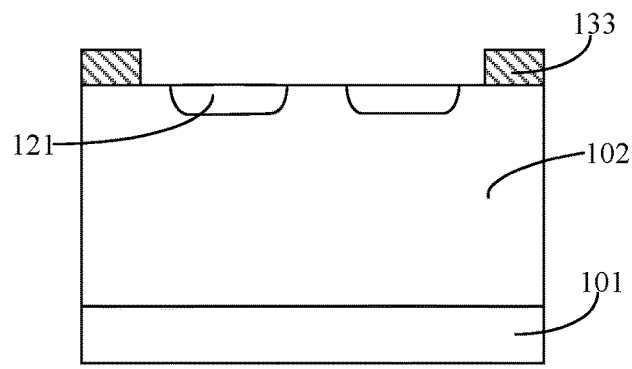

In FIG. 1D, removable layers 111 and 112 can be removed, and an etchant relative to semiconductor layer 133 and the base layer may be selected in order to remove removable layers 111 and 112.

Figure 1E:
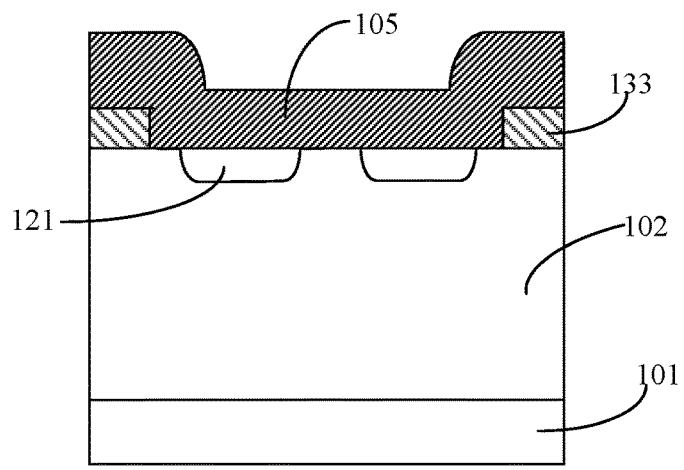

In FIG. 1E, second oxide layer 105 can be formed on the surface of semiconductor layer 133 and the first surface of epitaxial layer 102. For example, the second oxide layer may be formed by a chemical or physical vapor deposition process, or any other suitable deposition or oxidation processes.

Figure 1F:
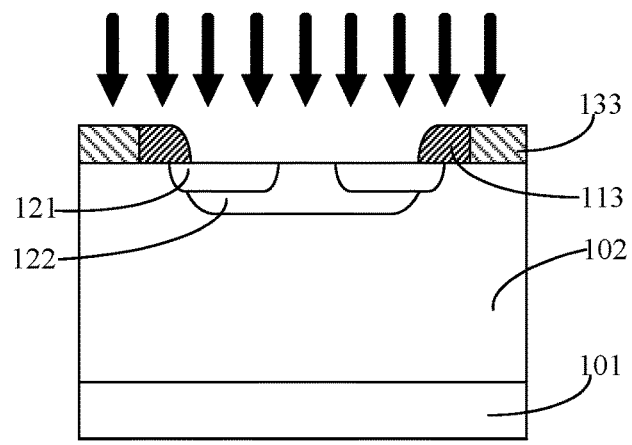

In FIG. 1F, second oxide layer 105 can be etched until the upper surface of semiconductor layer 133 and the first surface of epitaxial layer 102 are exposed. That is, the thickness of etching second oxide layer 105 may be equal to the thickness of second oxide layer 105 on the upper surface of semiconductor layer 133. Also, second oxide layer 105 remaining on the side surfaces of semiconductor layer 133 can be configured as sidewall spacers 113. Semiconductor layer 133 and sidewall spacers 113 can form a second barrier layer. Using the second barrier layer as a mask, contact region 122 of a second doping type may be formed in the epitaxial layer 102 by a self-aligned ion implantation process. For example, a junction depth of contact region 122 can be greater than a junction depth of source region 121. As discussed above, when second oxide layer 105 is etched, a very thin oxide layer can be retained on the first surface of the epitaxial layer, in order to protect the epitaxial layer when contact region 122 is formed and the base region is formed by subsequent processes. For example, the first doping type is one of N-type and P-type, and the second doping type is the other of N-type and P-type.

Figure 1G:
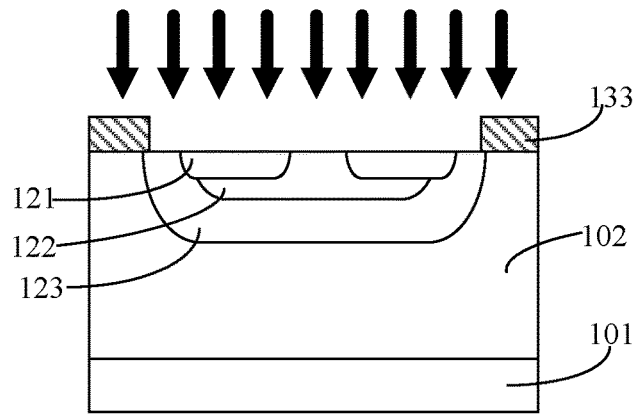

In FIG. 1G, sidewall spacers 113 may be removed, and semiconductor layer 133 can be used as a third barrier layer. Also, base region 123 of the second doping type can be formed by a self-aligned ion implantation process. For example, a junction depth of base region 123 can be greater than the junction depth of contact region 122, and a doping concentration of base region 123 may be less than a doping concentration of contact region 122. Further, semiconductor layer 133 can be removed after base region 123 is formed.

It should be noted that the formation of base region 123 can also be performed after the process of FIG. 1D (e.g., after removing removable layers 111 and 112). Semiconductor layer 133 in FIG. 1D can be used as a barrier layer to form the base region 123, and then the subsequent process may be performed, in order to form contact region 122. Further, after contact region 122 is formed, sidewall spacers 113 and semiconductor layer 133 can be removed. After source region 121, base region 123, and contact region 122 are formed, a high temperature annealing process can be performed in order to activate impurity atoms.

Figure 1H:
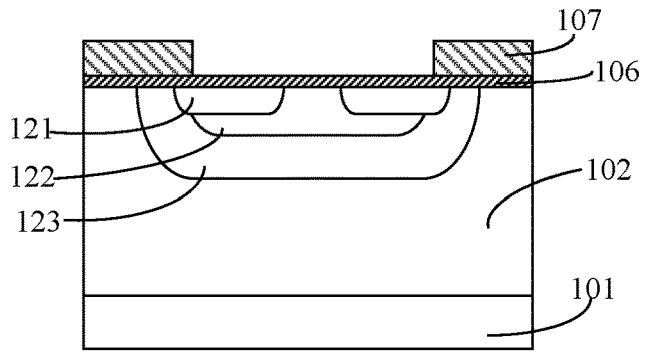

In FIG. 1H, gate oxide layer 106 can be formed on the first surface of epitaxial layer 102, and patterned gate conductor 107 may be formed on gate oxide layer 106. Gate conductor 107 can be located at the edge areas of the epitaxial layer 102, and may at least partially cover source region 121 and base region 123.

Figure 1I:
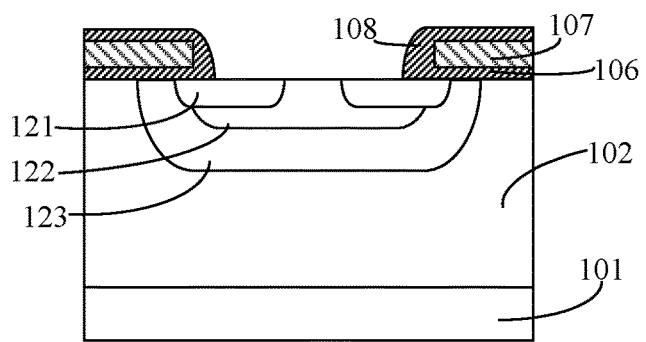

In FIG. 1I, an interlayer dielectric can be deposited on gate oxide layer 106 and gate conductor 107. Then, the interlayer dielectric and gate oxide layer 106 may be etched to form an opening, in order to expose the first surface of epitaxial layer 102. That is, the opening may partially expose the upper surface of source region 121 and contact region 122. Interlayer dielectric 108 may remain on the side surfaces and the upper surface of the gate conductor.

Figure 1J:
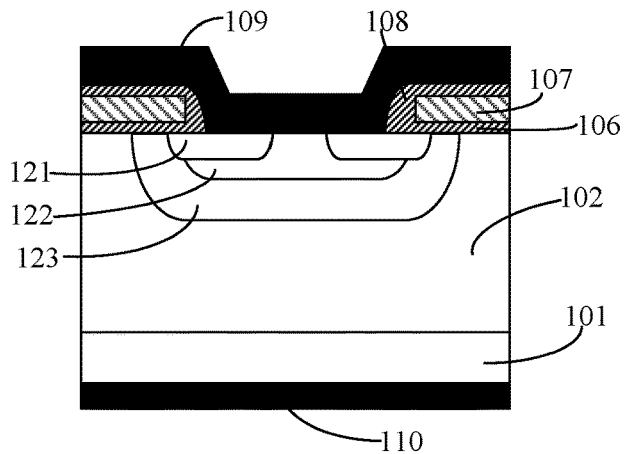

In FIG. 1J, a metal can be deposited on the openings and interlayer dielectric 108, in order to form source electrode 109. Also, a metal can be deposited on the backside of semiconductor substrate, in order to form a drain electrode 110. For example, the metal can be an alloy or any suitable metal.

Particular embodiments may also include a SiC MOSFET device formed according to the method discussed above, and as shown in FIG. 1J. The SiC MOSFET device can include semiconductor substrate 101, epitaxial layer 102 located on substrate 101, as well as base region 123, contact region 122, and source region 121 located in epitaxial layer 102. For example, contact region 122 and source region 121 may be located in base region 123. Source region 121 can include two separate parts, located at both sides of contact region 122. Semiconductor substrate 101, epitaxial layer 102, and source region 121 can be of a first doping type, and base region 123 and contact region 122 can be of a second doping type. The silicon carbide MOSFET device can also include gate oxide layer 106 on the first surface of the epitaxial layer, gate conductor 107 on gate oxide layer 106, and interlayer dielectric layer 108 on the side surface and upper surface of the gate conductor.

For example, the gate conductor can be located at the edge areas of the first surface of epitaxial layer 102, and may at least partially cover source region 121 and base region 123. The SiC MOSFET device can also include source electrode 109 on the first surface of epitaxial layer 102 and interlayer dielectric 108, and a drain electrode 110 on the back of the substrate. For example, the source electrode 109 can be electrically connected to the source region 121 and contact region 122. For example, a junction depth of contact region 122 can be greater than a junction depth of source region 121, a junction depth of base region 123 can be greater than the junction depth of contact region 122, and a doping concentration of base region 123 may be less than a doping concentration of contact region 122.

Figure 2A:
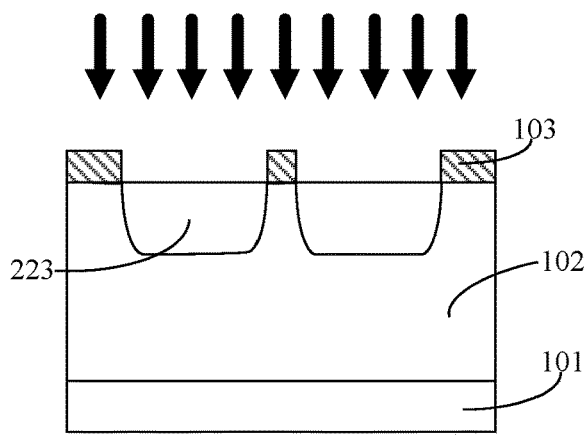
FIGS. 2A-2C show cross-sectional views of certain steps in a second example method of manufacturing a silicon carbide MOSFET, in accordance with embodiments of the present invention.
Figure 2B:
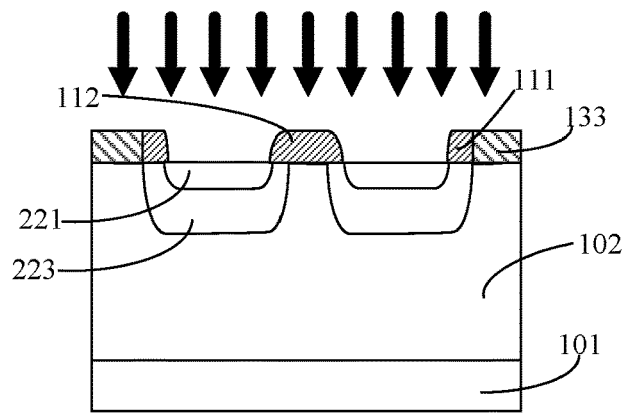
Figure 2C:
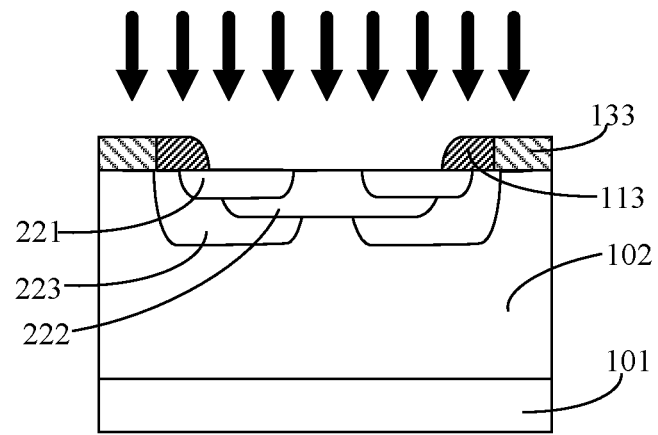

Referring now to FIGS. 2A-2C, shown are cross-sectional views of certain steps in a second example method of manufacturing a silicon carbide MOSFET, in accordance with embodiments of the present invention. In this particular example, the sequence of three ion implantations is the base region is formed first, then the source region is formed, and then the contact region is formed, while the other steps can be substantially the same.

In FIG. 1A, patterned deposition layer 103 can be formed on the first surface of the epitaxial layer. Referring now to FIG. 2A, patterned deposited layer 103 can then be used as a third barrier layer, and base region 223 of the second doping type may be formed in epitaxial layer 102 by a self-aligned ion implantation process. In this example, base region 223 can include two parts separated from each other.

Next, according to the process steps of FIGS. 1B and 1C, source region 221 of the first doping type, and as shown in FIG. 2B, may be formed. For example, source region 221 also can include two separate parts, which may respectively be located in the two parts of base region 223. For example, junction depth of source region 221 can be less than the junction depth of base region 223.

The process steps of FIGS. 1D, 1E, and 1F can be followed in order to form the contact region 222 of the second doping type, and as shown in FIG. 2C. For example, contact region 222 can connect two parts of the base region 223 together. The junction depth of contact region 222 can be less than the junction depth of base region 223, and the doping concentration of contact region 222 may be greater than the doping concentration of base region 223.

In particular embodiments, a SiC MOSFET device formed according to the manufacturing method of the example of FIGS. 2A-2C can also be provided. This example MOSFET device can have a shape of base region 223 that is different from that of base region 123 of the first example MOSFET device. As shown in FIG. 2C, base region 223 can include two parts separated from each other. Source region 221 can also include two separate parts, which may respectively located in the two parts of base region 223. It should be noted that although the shape of base region 223 formed in the second example is different from that of base region 123 formed by the method in the first example, its role in the MOSFET device is substantially the same.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of making a silicon carbide (SiC) MOSFET device, the method comprising:
   a) providing a base layer having a first doping type, wherein the base layer comprises a SiC semiconductor substrate and an epitaxial layer on the SiC semiconductor substrate;
   b) forming a patterned first barrier layer on a first surface of the base layer,
   c) forming a source region having the first doping type in the base layer using the patterned first barrier layer as an ion implantation mask to define the source region in the base layer;
   d) forming a base region having a second doping type, and forming a contact region having the second doping type, in the base layer;
   e) forming a gate structure located at an edge areas of a first surface of the epitaxial layer; and
   f) wherein the patterned first barrier layer comprises a first part and a second part, wherein the first part of the patterned first barrier layer comprises a semiconductor layer and a removable layer that is different from the semiconductor layer, and wherein the second part of the patterned first barrier layer only comprises the removable layer.

2. The method of claim 1, wherein the first part of the patterned first barrier layer is located at an edge area of the first surface of epitaxial layer and the second part of the patterned first barrier layer is located at a middle area of the first surface of epitaxial layer.

3. The method of claim 1, wherein the first part of the patterned first barrier layer is located at edge areas of the first surface of the base layer, the second part of the patterned first barrier layer is located at a middle area of the first surface of the base layer.

4. The method of claim 1, wherein prior to forming the patterned first barrier layer, further comprising forming a patterned deposition layer on the first surface of the base layer using a first mask, wherein the patterned deposition layer comprises a first part and a second part.

5. The method of claim 4, wherein the first part of the patterned deposition layer is located at edge areas of the first surface of the base layer, and the second part of the patterned deposition layer is located at a middle area of the first surface of the base layer.

6. The method of claim 4, wherein the forming the patterned first barrier layer comprises:
 a) forming, by a thermal oxidation process, a first oxide layer on the first surface of the base layer and the patterned deposition layer;
 b) etching a portion of the first oxide layer to form the patterned first barrier layer; and
 c) wherein, in the thermal oxidation process, the first part of the patterned deposited layer is partially oxidized into the first oxide layer, the second part of the deposition layer is completely oxidized into the first oxide layer, the patterned deposition layer remaining on the first surface of the base layer is configured as the semiconductor layer, and the first oxide layer is configured as the removable layer.

7. The method of claim 6, wherein the second part of the patterned deposition layer is completely oxidized by controlling a width of the second part of the patterned deposition layer.

8. The method of claim 5, wherein a width of the second part of the patterned deposition layer is not greater than a length of the channel of the device.

9. The method of claim 4, wherein the patterned deposition layer comprises polysilicon or amorphous silicon.

10. The method of claim 6, wherein a difference between width of the first oxide layer formed by oxidizing the first part of the deposition layer, and length of a channel of the device is not greater 5% of the length of a channel of the device.

11. The method of claim 1, further comprising removing the removable layer of the patterned first barrier layer.

12. The method of claim 11, wherein the forming the contact region comprises:
 a) forming a second oxide layer located on the first surface of the base layer and the semiconductor layer;
 b) etching the second oxide layer to form sidewall spacers on side surfaces of the semiconductor layer; and
 c) forming the contact region using the semiconductor layer and the sidewall spacers as a second barrier layer.

13. The method of claim 12, wherein after the forming the contact region, the forming the base region comprises:
 a) removing the sidewall spacers; and
 b) forming the base region using the semiconductor layer as a third barrier layer.

14. The method of claim 11, prior to the forming the contact region, the forming the base region comprises forming the base region using the semiconductor layer of the patterned first barrier layer as a third barrier layer.

15. The method of claim 4, prior to the forming the source region, the forming the base region comprises forming the base region using the patterned deposited layer as a third barrier layer.

16. The method of claim 13, further comprising removing the semiconductor layer.

17. The method of claim 12, further comprising removing the semiconductor layer and the sidewall spacers.

18. The method of claim 16, wherein the forming the gate structure comprises:
 a) forming a gate oxide layer on the first surface of the epitaxial layer;
 b) forming a patterned gate conductor on the gate oxide layer;
 c) depositing an interlayer dielectric on the first surface of the base layer and the gate conductor;
 d) etching the interlayer dielectric and the gate oxide layer to form an opening in order to expose a portion of the first surface of the base region and the source region;
 e) depositing a metal on the opening and the second surface of the base layer in order to form a source electrode and a drain electrode; and
 f) wherein the gate conductor covers a portion of the base region and the source region, and the first surface and the second surface of the base layer are opposite to each other.

19. The method of claim 12, wherein the second oxide layer is formed by a vapor deposition process.

20. An apparatus formed according to the method of claim 1.

* * * * *

UNITED STATES PATENT AND TRADEMARK OFFICE
CERTIFICATE OF CORRECTION

| | |
|---|---|
| PATENT NO. | : 11,670,502 B2 |
| APPLICATION NO. | : 17/235103 |
| DATED | : June 6, 2023 |
| INVENTOR(S) | : Jiakun Wang et al. |

It is certified that error appears in the above-identified patent and that said Letters Patent is hereby corrected as shown below:

In the Claims

In Column 7, Line 31, Claim 10, delete "greater 5%" and insert -- greater than 5% --, therefor.

Signed and Sealed this
Seventh Day of November, 2023

Katherine Kelly Vidal
*Director of the United States Patent and Trademark Office*